(12) United States Patent
Nishiki et al.

(10) Patent No.: US 8,168,511 B2
(45) Date of Patent: May 1, 2012

(54) DISPLAY DEVICE MANUFACTURING METHOD AND LAMINATED STRUCTURE

(75) Inventors: Hirohiko Nishiki, Osaka (JP); Tohru Okabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 185 days.

(21) Appl. No.: 12/675,501

(22) PCT Filed: Jun. 12, 2008

(86) PCT No.: PCT/JP2008/001509
§ 371 (c)(1),
(2), (4) Date: Feb. 26, 2010

(87) PCT Pub. No.: WO2009/037797
PCT Pub. Date: Mar. 26, 2009

(65) Prior Publication Data
US 2011/0204361 A1 Aug. 25, 2011

(30) Foreign Application Priority Data

Sep. 20, 2007 (JP) ................................. 2007-243629

(51) Int. Cl.
*H01L 21/30* (2006.01)
(52) U.S. Cl. ........................... 438/458; 438/30; 438/455

(58) Field of Classification Search .............. 438/28–38, 438/455–459, E21.122
See application file for complete search history.

(56) References Cited

U.S. PATENT DOCUMENTS

| 6,127,199 | A | 10/2000 | Inoue et al. | |
|---|---|---|---|---|
| 7,045,442 | B2 * | 5/2006 | Maruyama et al. | 438/458 |
| 7,122,445 | B2 * | 10/2006 | Takayama et al. | 438/458 |
| 7,335,573 | B2 * | 2/2008 | Takayama et al. | 438/455 |
| 7,479,442 | B2 * | 1/2009 | Noguchi et al. | 438/458 |
| 8,058,146 | B2 * | 11/2011 | Kuwabara | 438/458 |

FOREIGN PATENT DOCUMENTS

JP 2002-31818 A 1/2002

OTHER PUBLICATIONS

Official Communication issued in International Patent Application No. PCT/JP2008/001509, mailed on Sep. 9, 2008.

* cited by examiner

*Primary Examiner* — Cuong Q Nguyen
(74) *Attorney, Agent, or Firm* — Keating & Bennett, LLP

(57) ABSTRACT

A method for manufacturing a display device includes a step of preparing a flexible substrate including a delamination layer on its back surface, a step of bonding a support substrate to the delamination layer of the flexible substrate via an adhesive layer, a step of forming predetermined devices on a front surface of the flexible substrate having the support substrate bonded thereto, and a step of removing the support substrate by delaminating the delamination layer from the flexible substrate having the devices formed thereon.

34 Claims, 6 Drawing Sheets

DISPLAY DEVICE MANUFACTURING METHOD AND LAMINATED STRUCTURE

BACKGROUND OF THE INVENTION

1. Field of the Invention

The present invention relates to methods for manufacturing a display device, and laminated structures.

2. Description of the Related Art

In addition to having the display quality at least equivalent to conventional cathode ray tubes (CRTs), active matrix liquid crystal displays (TFT-LCDs), which use semiconductor thin film transistors (TFTs) as driving devices, have characteristics such as a thin thickness, light weight, high definition, low power consumption, and an ability to increase the display size, as compared to the CRTs. Due to these characteristics, the TFT-LCDs are currently used in various fields as next generation displays that replace the CRTs. Organic electroluminescence (EL) displays and the like have also attracted attention as next generation display devices in recent years. Although many of such image display devices are currently formed on glass substrates, it is expected that, in the future, the image display devices will be used as flexible displays by using plastic substrates, stainless steel substrates, and the like. Such flexible displays are advantageous since they are not broken even when folded or rolled, and can be carried in a compact form.

In order to form the flexible displays by the technologies of LCDs, organic EL, and the like, plastic, stainless steel, and the like need to be used as substrate materials. Due to their flexibility, it is generally very difficult to carry and process such substrates by conventional process apparatuses for processing glass substrates. Thus, a major remodeling is required to enable the conventional process apparatuses for glass substrates to process plastic substrates and the like. However, this requires enormous investments, which result in a price increase of final products. In a conventional method developed as a solution to these problems, a plastic substrate is carried and processed after being bonded to a glass substrate, and is removed from the glass substrate after fabrication of devices.

A delamination transfer method is also proposed in Japanese Published Patent Application No. H10-206896 and the like, as a method of fabricating thin film devices on a glass substrate, transferring only the device layer onto a temporary substrate, and then, transferring the device layer again onto a plastic substrate. In this method, a delamination layer of hydrogenated amorphous silicon, and a protective layer are first formed on a glass substrate, and then, devices are fabricated by a commonly used process. Then, a weak adhesive layer is formed on the device surface to bond a temporary transfer substrate to the glass substrate. Then, the back surface of the glass substrate is irradiated with laser light, whereby hydrogen is generated from the delamination layer. Thus, the device layer delaminates from the interface between the delamination layer and the protective layer, and the device layer is transferred in an inverted fashion onto the temporary transfer substrate. Then, a permanent adhesive is formed on a flexible substrate, such as a plastic substrate, and the device layer of the temporary transfer substrate is bonded to the flexible substrate. Thereafter, the temporary transfer substrate is delaminated from the weak adhesive layer, whereby delamination and transfer of the device layer onto the plastic substrate is completed. In this laser delamination transfer method, devices are fabricated on conventional glass substrates. Thus, a major advantage of the laser delamination transfer method is that this method not only enables the apparatuses for glass substrates to be used, but also enables exactly the same high temperature process as in conventional examples to be used without the need to consider the problems that occur when using the plastic substrates, such as the heat resistance and the water absorbing property.

In order to fabricate devices such as TFTs on a flexible substrate, such as a plastic substrate, bonded to a glass substrate, strong adhesion is required to prevent delamination of the flexible substrate during a chemical solution process or a high temperature process. Actually, conventional adhesives are progressively cured by the heat history when subjected to a high temperature process several times, whereby the adhesion strength increases more than intended. Thus, the adhesion strength often becomes higher than in the initial state by the time fabrication of the TFT devices is completed. However, it is very difficult to delaminate the strongly bonded plastic substrate after fabrication of the devices. Forcibly delaminating the plastic substrate can partially break the substrate, or can damage the devices formed thereon.

The use of adhesives that are not resistant to heat and chemical solutions also has a problem. Adhesion strength of the adhesives is reduced by a heat treatment and a chemical treatment, and the plastic substrate delaminates from the glass substrate during the process.

In the laser delamination transfer method proposed as one of the methods for delaminating and transferring a device layer onto a plastic substrate, a hydrogenated amorphous silicon layer, which is formed as a delamination layer directly under the device layer, is irradiated with laser light via the back surface of a glass substrate. The device layer is delaminated from the glass substrate, and at the same time transferred onto a temporary transfer substrate by using the desorption force of hydrogen. However, a thin film having an overall thickness of about several micrometers is actually very fragile, and it is very difficult to stably delaminate the thin film from the glass substrate. For example, if the delamination layer is not sufficiently irradiated with laser light due to foreign matter, small scratches on the back surface of the glass substrate, or the like, the adhesion strength of that part is not reduced, and the device layer can be easily chipped when the temporary transfer substrate is delaminated from the glass substrate. A similar problem can occur when the hydrogenated amorphous silicon as the delamination layer varies in quality and thickness. Energy stability of the laser itself is also a problem. The laser delamination transfer method usually uses excimer laser that is easily absorbed by hydrogenated amorphous silicon. However, the radiation energy of the excimer laser itself is unstable, and the energy radiation significantly varies every time the excimer laser is used. Moreover, it is difficult to control the desorption force of hydrogen from hydrogenated amorphous silicon. Thus, as described above, insufficient irradiation with the laser light does not sufficiently reduce the adhesion strength, causing chippings and defects of the device layer. Excessive irradiation with the laser light can break the device layer due to a too strong desorption force of hydrogen, and can cause the device layer to be directly damaged by the laser light that has passed through the delamination layer.

Moreover, even after the delamination layer is transferred onto the temporary transfer substrate, any residue of the delamination layer adhering to the device transfer layer needs to be removed. At this time, the device layer, bonded to the temporary bonding substrate with weak bonding strength, is easily broken as it is repeatedly subjected to a dry etching process and a wet cleaning process. Moreover, one of the major problems of the delamination transfer method is that the delamination layer needs to be delaminated and transferred to the plastic substrate when the TFT process is completed. LCD manufacturing processes include a liquid crystal process in which a liquid crystal material is enclosed in a liquid crystal cell after TFT devices are fabricated. However, in the delamination transfer method, the device layer needs to be held on the temporary transfer substrate when the device layer is transferred. Thus, the delamination transfer process cannot be used for the liquid crystal process in which the substrate and a counter substrate are bonded together. Thus, a separate technique of stably carrying a soft plastic substrate is therefore essential.

A method of etching the glass substrate itself to remove the device layer has also been proposed in the delamination transfer method. However, etching of the glass substrate requires a very strong hydrofluoric acid solution. Since such a hydrofluoric acid solution easily damages the device layer, a strong barrier thin film is required. However, if the barrier film has defects, the device layer is extensively damaged by an etchant that has passed through the barrier film.

SUMMARY OF THE INVENTION

In view of the above problems, preferred embodiments of the present invention provide a method for manufacturing a display device, and a laminated structure, in which a flexible substrate is satisfactorily bonded to a support substrate while the flexible substrate is being processed or carried, and damage to the flexible substrate is satisfactorily prevented and minimized when removing the support substrate.

A method for manufacturing a display device according to a preferred embodiment of the present invention includes: a substrate preparing step of preparing a flexible substrate including a delamination layer formed on a back surface thereof; a support substrate bonding step of bonding a support substrate to the delamination layer of the flexible substrate via an adhesive layer; a device forming step of forming predetermined devices on a front surface of the flexible substrate having the support substrate bonded thereto; and a support substrate removing step of removing the support substrate by delaminating the delamination layer from the flexible substrate having the devices formed thereon.

According to this configuration, the support substrate is bonded to the flexible substrate via the adhesive layer. Thus, the flexible substrate can be carried, processed, and the like in a reliably fixed state without changing the shape. When removing the support substrate after the flexible substrate is carried, processed, and the like, not the adhesive layer but the delamination layer provided separately is delaminated to remove the support substrate from the flexible substrate. Thus, even if a material having high adhesion strength is used for the adhesive layer to firmly fix the flexible substrate to the support substrate, the adhesive layer is not involved in the delamination, and thus, damage to the flexible substrate can be satisfactorily reduced when removing the support substrate.

In a method according to a preferred embodiment of the present invention, the delamination layer may preferably contain hydrogen, and in the support substrate removing step, the back surface of the flexible substrate may preferably be irradiated with light so as to desorb hydrogen from the delamination layer, whereby the delamination layer may be delaminated from the flexible substrate.

According to this configuration, the back surface of the flexible substrate is irradiated with light, and the delamination layer is delaminated by desorption of hydrogen. This satisfactorily reduces production of a residue of the delamination layer on the back surface of the flexible substrate. Thus, the quality of the display device is improved.

In a method according to a preferred embodiment of the present invention, the delamination layer may preferably be made of an amorphous silicon thin film, for example.

According to this configuration, since the delamination layer is preferably made of an amorphous silicon thin film, desorption of hydrogen tends to be caused by irradiation with light. Thus, the delamination layer can be more satisfactorily delaminated by irradiation with light.

In a method according to a preferred embodiment of the present invention, a hydrogen concentration in the amorphous silicon thin film is preferably about 4 mass % to about 30 mass %, and more preferably about 10 mass % to about 20 mass %, for example.

According to this configuration, since the hydrogen concentration in the amorphous silicon thin film is preferably about 4 mass % to about 30 mass %, and more preferably about 10 mass % to about 20 mass %, for example, desorption of hydrogen from the delamination layer is more satisfactorily caused by irradiation with light. Thus, the delamination layer can be more effectively delaminated.

Moreover, in a method according to a preferred embodiment of the present invention, the amorphous silicon thin film may be formed by applying a solution, which preferably includes grains containing amorphous silicon and having a grain size of about 1 nm to about 100 nm, for example, to the back surface of the flexible substrate to form a film, and then, subjecting the film to a heat treatment to form a dense film.

According to this configuration, since the amorphous silicon thin film is formed by applying a solution, which preferably includes grains containing amorphous silicon and having a grain size of about 1 nm to about 100 nm, for example, to the back surface of the flexible substrate to form a film, and then, subjecting the film to a heat treatment to form a dense film, the manufacturing cost of the device can be reduced.

In a method according to a preferred embodiment of the present invention, the light may preferably have a wavelength of about 250 nm to about 650 nm, and more preferably about 350 nm to about 550 nm, for example.

According to this configuration, since the light preferably has a wavelength of about 250 nm to about 650 nm, more preferably about 350 nm to about 550 nm, for example, desorption of hydrogen occurs satisfactorily. Thus, the delamination layer can be more effectively delaminated.

Moreover, in a method of the present invention, the delamination layer may preferably be formed with a thickness of about 30 nm to about 1,000 nm, and more preferably about 100 nm to about 500 nm, for example.

According to this configuration, the delamination layer is preferably formed with a thickness of about 30 nm or more (more preferably about 100 nm or more). This reduces transmission of the light through the delamination layer. Forming the delamination layer with a thickness of preferably about 1,000 nm or less (more preferably about 500 nm or more) reduces the possibility that productivity is significantly reduced when forming the delamination layer.

In a preferred embodiment of a method of the present invention, the adhesive layer may preferably be made of a silicone resin, for example.

According to this configuration, since the adhesive layer is preferably made of a silicone resin, the adhesive layer has elasticity even after it is cured. Thus, even if a stress is generated by misalignment between the flexible substrate and the support substrate, the stress can be prevented and minimized.

Moreover, in a method according to a preferred embodiment of the present invention, the adhesive layer may be formed with a thickness of preferably about 5 µm to about 300 µm, and more preferably about 50 µm to about 150 µm, for example.

According to this configuration, since the adhesive layer is preferably formed with a thickness of about 5 µm or more (more preferably about 50 µm or more), the adhesive layer does not easily delaminate. Moreover, since the adhesive layer is preferably formed with a thickness of about 300 µm or less (more preferably about 150 µm or less), thermal contraction of the adhesive layer can be satisfactorily reduced in a heat treatment or the like.

In a method according to a preferred embodiment of the present invention, a difference in linear expansion coefficient between the support substrate and the flexible substrate may preferably be 0 to about 10 ppm/° C., and more preferably 0 to about 3 ppm/° C.

According to this configuration, the difference in linear expansion coefficient between the support substrate and the flexible substrate is preferably 0 to about 10 ppm/° C. (more preferably 0 to about 3 ppm/° C.). This satisfactorily reduces an adverse effect on the manufacturing process due to warping or the like of the flexible substrate caused while the flexible substrate bonded to the support substrate is being carried and processed.

Moreover, in a method according to a preferred embodiment of the present invention, the flexible substrate may preferably have a thickness of about 3 µm to about 200 µm, and more preferably about 30 µm to about 100 µm, for example.

Moreover, in a method according to a preferred embodiment of the present invention, the support substrate may preferably have a thickness of about 0.5 mm to about 1.5 mm, and more preferably about 0.7 mm to about 1.1 mm, for example.

Moreover, in a method according to a preferred embodiment of the present invention, a protective layer may preferably be provided between the flexible substrate and the delamination layer, which are prepared in the substrate preparing step.

According to this configuration, since the protective layer is provided between the flexible substrate and the delamination layer, which are prepared in the substrate preparing step, damage to the flexible substrate, the devices formed thereon, and the like can be satisfactorily reduced and minimized when removing the delamination layer.

In a method according to a preferred embodiment of the present invention, the protective layer may preferably be made of a metal thin film, for example.

According to this configuration, since the protective layer is preferably made of a metal thin film, the protective layer can be formed and removed by simple processes, thereby increasing the manufacturing efficiency.

Moreover, in a method according to a preferred embodiment of the present invention, the metal thin film may preferably include Al, Ag, or Mo, for example.

According to this configuration, since the metal thin film contains Al, Ag, or Mo, removal of the protective layer by etching or the like is facilitated, thereby increasing the manufacturing efficiency.

In a method according to a preferred embodiment of the present invention, the protective layer may preferably have a thickness of about 50 nm to about 1,000 nm, and more preferably about 100 nm to about 300 nm, for example.

Moreover, in a method according to a preferred embodiment of the present invention, the delamination layer may preferably be made of a resin layer, for example.

In a method according to a preferred embodiment of the present invention, the resin layer for the delamination layer may be made of a polyimide resin, or a resin containing carbon grains, for example.

According to this configuration, since the resin layer for the delamination layer is preferably made of a polyimide resin, or a resin containing carbon grains, a thermal expansion property of the delamination layer is improved, whereby the delamination layer can be more reliably delaminated from the flexible substrate.

Moreover, in a method according to a preferred embodiment of the present invention, the delamination layer may preferably be delaminated by its own thermal expansion.

According to this structure, since the delamination layer is preferably delaminated by its own thermal expansion in the support substrate removing step, the delamination layer can be delaminated by a simple apparatus, whereby the manufacturing cost can be reduced.

In a method according to a preferred embodiment of the present invention, the delamination layer may preferably be made of a metal thin film.

Moreover, in a method according to a preferred embodiment of the present invention, the metal thin film of the delamination layer may preferably contain Al.

According to this configuration, since the metal thin film of the delamination layer contains Al, a stress is concentrated in a region between the delamination layer and an insulating layer on the flexible substrate side, whereby the delamination layer can be more reliably delaminated from the flexible substrate.

Moreover, in a method according to a preferred embodiment of the present invention, the support substrate may preferably be made of glass containing $SiO_2$, for example.

According to this configuration, since the support substrate is preferably made of glass containing $SiO_2$, light, with which the flexible substrate is irradiated to delaminate the substrate, can be satisfactorily transmitted through the support substrate onto the delamination layer. Moreover, the flexible substrate can be reliably supported, and the manufacturing cost can be reduced.

In a method according to a preferred embodiment of the present invention, the support substrate may preferably have a linear expansion coefficient of about 4 ppm/° C. to about 20 ppm/° C., and more preferably about 8 ppm/° C. to about 15 ppm/° C., for example.

Moreover, in a method according to a preferred embodiment of the present invention, a barrier layer may preferably be formed on back and/or end surfaces of the support substrate at least before the support substrate removing step.

For example, if the support substrate includes an alkali or the like to adjust the linear expansion coefficient, the alkali dissolves from the support substrate when placing the flexible substrate, bonded to the support substrate, into a treatment solution (a chemical solution), whereby the flexible substrate can be damaged. However, according to the above configuration, the barrier layer is formed on the back and/or end surfaces of the support substrate at least before the support substrate removing step. This satisfactorily reduces damage to the flexible substrate caused by the alkali that dissolves from the support substrate into the treatment solution.

In a method of the present invention, the barrier layer may preferably be formed by laminating any one of a SiNx layer, a $SiO_2$ layer, a SiON layer, and an organic insulating layer, or by laminating layers selected from these layers, for example.

According to this configuration, the barrier layer is preferably formed by laminating any one of a SiNx layer, a $SiO_2$ layer, a SiON layer, and an organic insulating layer, or by laminating layers selected from these layers. This satisfactorily reduces dissolution of an alkali or the like in the support substrate into a treatment solution (a chemical solution).

A method for manufacturing a display device according to a preferred embodiment of the present invention includes a substrate preparing step of preparing first and second flexible substrates, each including a delamination layer formed on a back surface thereof; a support substrate bonding step of respectively bonding support substrates to the delamination layers, which are respectively formed on the first and second flexible substrates, via respective adhesive layers; a device forming step of forming predetermined devices over each of respective front surfaces of the first and second flexible substrates having the support substrates respectively bonded thereto; a substrate bonding step of bonding the first and second flexible substrates, each having the devices formed thereon, with each other so that the respective front surfaces of the first and second flexible surfaces face each other; and a support substrate removing step of respectively removing the support substrates from the first and second flexible substrates bonded together, by respectively delaminating the delamination layers.

According to this configuration, the support substrates are respectively bonded to the first and second flexible substrates via the respective adhesive layers. Thus, the first and second flexible substrates can be carried, processed, and the like in a reliably fixed state without changing the shape. When removing the support substrates after the first and second flexible substrates are carried, processed, and the like, not the adhesive layers but the delamination layers provided separately are delaminated to remove the support substrates from the first and second flexible substrates, respectively. Thus, even if a material having high adhesion strength is used for the adhesive layers to firmly fix the first and second flexible substrates to the support substrates, respectively, the adhesive layers are not involved in the delamination, and thus, damage to the first and second flexible substrates can be satisfactorily reduced when removing the support substrates.

A laminated structure according to a preferred embodiment of the present invention includes a flexible substrate including an insulating layer located on front and back surfaces thereof; a metal thin film including Al, Ag, or Mo, and located on the insulating layer on the back surface of the flexible substrate; and an amorphous silicon thin film located on the metal thin film.

The use of the laminated structure of this configuration enables a support substrate to be bonded to the flexible substrate via an adhesive layer, and enables the flexible substrate to be carried, processed, and the like in a reliably fixed state without changing the shape. When removing the bonded support substrate after the flexible substrate is carried, processed, and the like, not the adhesive layer but the amorphous silicon thin film provided separately can be delaminated to remove the support substrate from the flexible substrate. Thus, even if a material having high adhesion strength is used for the adhesive layer to firmly fix the flexible substrate to the support substrate, the adhesive layer is not involved in the delamination, and thus, damage to the flexible substrate can be satisfactorily reduced when removing the support substrate.

Various preferred embodiments of the present invention provide a method for manufacturing a display device, and a laminated structure, in which a flexible substrate is satisfactorily bonded to a support substrate while the flexible substrate is being processed or carried, and damage to the flexible substrate is satisfactorily reduced and minimized when removing the support substrate.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Although preferred embodiments of the present invention will be described in detail below, the present invention is not limited to these preferred embodiments.

First Preferred Embodiment

A method for manufacturing a display device according to a first preferred embodiment of the present invention will be described. An LCD will be described as an example of the display device.

Figure 1:
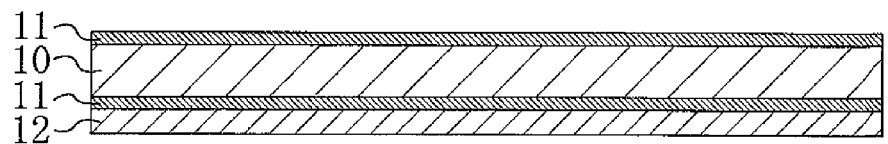
FIG. 1 is a cross-sectional view of a plastic substrate having a hydrogenated amorphous silicon layer formed thereon, according to a first preferred embodiment of the present invention.

First, as shown in FIG. 1, a plastic substrate 10, having a thickness of, e.g., about 3 μm to about 200 μm, and more preferably about 30 μm to about 100 μm, is prepared as a flexible substrate. The plastic substrate 10 may be made of polyether sulfone (PES), polycarbonate, a polyolefin resin, an acrylic resin, polypropylene, polyester, polyethylene, or the like. Note that the flexible substrate is not limited to the plastic substrate 10, and may be a stainless steel foil substrate or the like.

Next, an insulating layer 11 is formed on the front and back surfaces of the plastic substrate 10. Each insulating layer 11 is preferably formed by laminating, e.g., either an inorganic insulating layer, such as a SiNx layer, a $SiO_2$ layer, and a SiON layer, or an organic insulating layer, or by laminating layers selected from these layers. Each insulating layer 11 preferably has a thickness of, e.g., about 10 nm to about 1,000 nm.

The inorganic insulating layer is preferably formed by a method such as a sputtering method that is conventionally used in the art. The formation temperature is determined according to the heat resistance and the thermal expansion coefficient of the plastic substrate 10. For example, in the case of a heat resistant plastic substrate (heat resistance: about 250° C., and linear expansion coefficient: about 10 ppm/° C. to about 20 ppm/° C.), the inorganic insulating layer is preferably formed at about 150° C. to about 200° C. in view of the temperature rise during formation of the insulating layer.

The organic insulating layer is formed by coating the surface of the plastic substrate 10 with an uncured liquid resin material, or laminating a dry film onto the surface of the plastic substrate 10, and then, curing the uncured liquid resin material or the dry film at around 150° C. to about 200° C.

The insulating film 11 serves to reduce moisture absorption into the plastic substrate 10, to improve adhesion between other thin film layer and the plastic substrate 10, and the like.

Then, a hydrogenated amorphous silicon layer 12 (a delamination layer) is formed on the back surface of the plastic substrate 10. The hydrogenated amorphous silicon layer 12 is formed by hydrogenating amorphous silicon. The hydrogenated amorphous silicon layer 12 preferably can be formed by methods that are conventionally used, such as a plasma chemical vapor deposition (CVD) method. Other possible methods for forming the hydrogenated amorphous silicon layer 12 include a reactive sputtering method using a silicon target and a process gas of Ar and $H_2$ gas, and a method using a coating process and a heat treatment. In the method using a coating process and a heat treatment, fine grains of hydrogenated amorphous silicon having a grain size of about 1 nm to about 100 nm are dispersed in a solution, and the back surface of the plastic substrate 10 is coated with the resultant solution. Then, the coating film is dried by a heat treatment to form a dense film. The thickness of the hydrogenated amorphous silicon layer 12 preferably is about 30 nm to about 1,000 nm, and more preferably about 100 nm to about 500 nm. The hydrogenated amorphous silicon layer 12 is formed so that the hydrogen concentration in the amorphous silicon thin film becomes about 4 mass % to about 30 mass %, and more preferably about 10 mass % to about 20 mass %.

Figure 2:
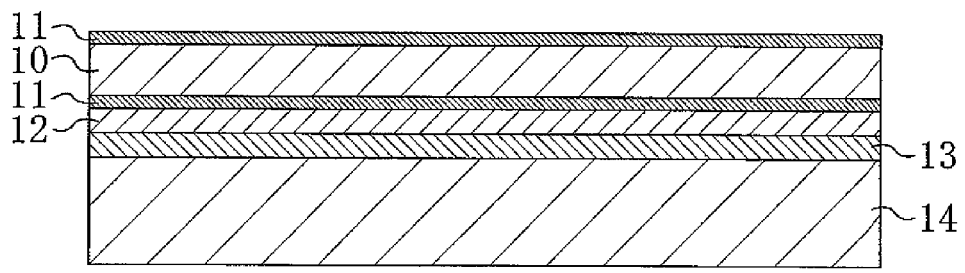
FIG. 2 is a cross-sectional view of the plastic substrate having a support substrate formed thereon, according to the first preferred embodiment of the present invention.

Then, a support substrate 14, having an adhesive layer 13 formed on its surface, is prepared as shown in FIG. 2. Respective materials of the adhesive layer 13 and the support substrate 14 are selected so that the adhesive layer 13 and the support substrate 14 are resistant to processes to be used, and are not warped by a heat treatment or the like while retaining sufficient adhesion strength. Specifically, a glass substrate (thickness: e.g., about 0.5 mm to about 1.5 mm, and more preferably about 0.7 mm to about 1.1 mm) containing mainly $SiO_2$ can be preferably used as the support substrate 14, and a silicone resin adhesive layer 13 (thickness: e.g., about 5 μm to about 300 μm, and more preferably about 50 μm to about 150 μm) can preferably be applied to the glass substrate. The support substrate 14 is formed so that the difference in linear expansion coefficient between the support substrate 14 and the flexible substrate preferably is 0 to about 10 ppm/° C., and more preferably 0 to about 3 ppm/° C. In the present preferred embodiment, the support substrate 14 preferably has a linear expansion coefficient of about 4 ppm/° C. to about 20 ppm/° C., and more preferably about 8 ppm/° C. to about 15 ppm/° C., for example.

Note that the support substrate 14 may have a barrier layer on its back and/or end surfaces. The barrier layer is preferably formed by laminating any one of a SiNx layer, a $SiO_2$ layer, a SiON layer, and an organic insulating layer 11, or by laminating layers selected from these layers.

Then, the plastic substrate 10 having the hydrogenated amorphous silicon layer 12 formed thereon is bonded to the support substrate 14 via the adhesive layer 13. At this time, the plastic substrate 10 is bonded to the support substrate 14 so that the hydrogenated amorphous silicon layer 12 formed over the back surface of the plastic substrate 10 faces the support substrate 14.

Figure 3:
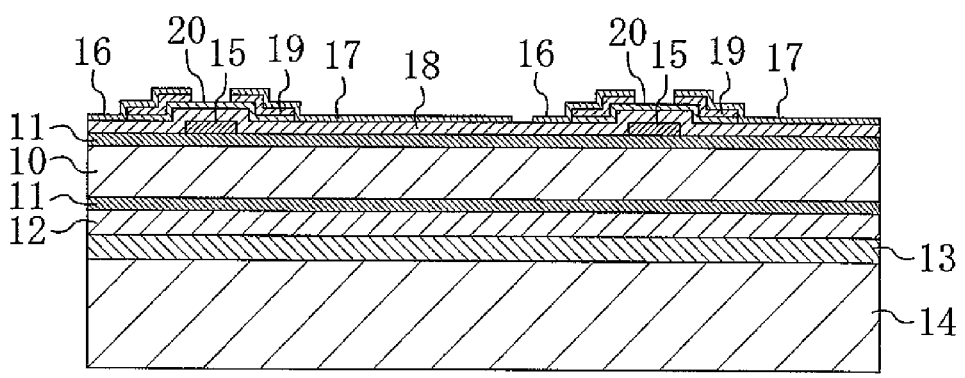
FIG. 3 is a cross-sectional view of the plastic substrate having TFT devices formed thereon, according to the first preferred embodiment of the present invention.

Then, as shown in FIG. 3, TFT devices, such as gate electrodes 15, source electrodes 16, drain electrodes 17, a gate insulating film 18, contact layers 19, and semiconductor layers 20, are formed over the plastic substrate 10 in a manner similar to the case where TFT devices are formed on a glass substrate. TFT process conditions, such as a process temperature, time, and chemicals to be used, are optimized as appropriate so as not to damage the plastic substrate 10 and the adhesive layer 13. For example, in the case of a heat resistant plastic substrate (heat resistance: about 250° C., and linear expansion coefficient: about 10 ppm/° C. to about 20 ppm/° C.), the deposition temperature of a plasma CVD method that uses the highest process temperature is reduced to as low as about 200° C., for example. The deposition conditions (such as a pressure, and radio frequency (RF) output) need to be optimized accordingly.

Figure 4:
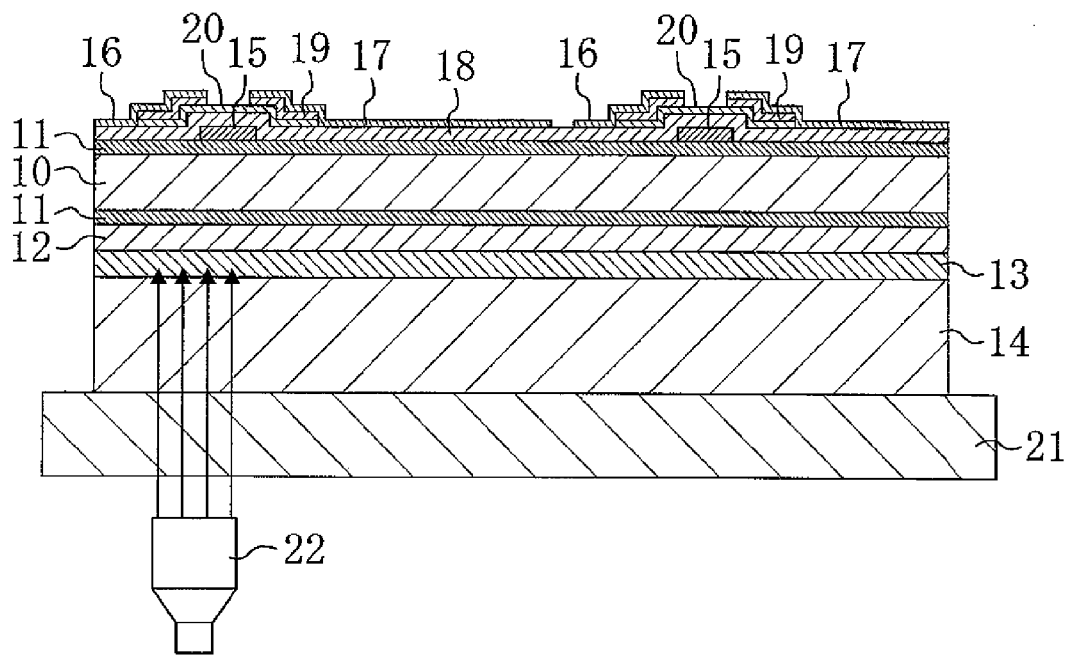
FIG. 4 is a cross-sectional view of the plastic substrate subjected to laser light, according to the first preferred embodiment of the present invention.

Then, as shown in FIG. 4, the plastic substrate 10 is placed on a substrate stage 21, and the back surface of the plastic substrate 10 is irradiated with laser light via the support substrate 14 by using a laser light source 22. The hydrogenated amorphous silicon layer 12 is rapidly heated by the laser light, whereby hydrogen is desorbed from the hydrogenated amorphous silicon layer 12. The wavelength of the laser light is about 250 nm to about 650 nm, and more preferably about 350 nm to about 550 nm, for example.

Figure 5:
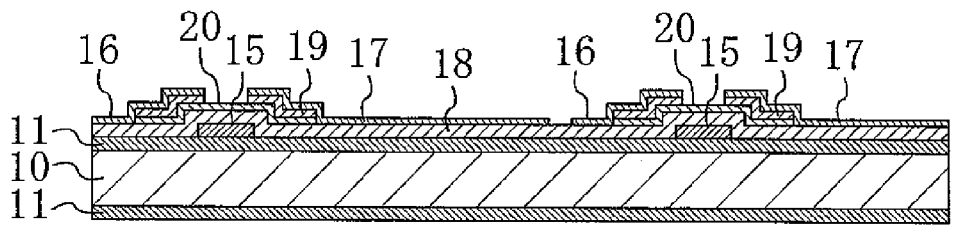
FIG. 5 is a cross-sectional view of the plastic substrate from which the hydrogenated amorphous silicon layer has been delaminated, according to the first preferred embodiment of the present invention.

As shown in FIG. 5, as hydrogen is desorbed, the hydrogenated amorphous silicon layer 12 delaminates from the plastic substrate 10, whereby the support substrate 14 is removed from the plastic substrate 10. Optimizing the laser energy, the laser exposure time, and the like enables the plastic substrate 10 to be delaminated from the interface between the insulating layer 11 and the hydrogenated amorphous silicon layer 12 without damaging the insulating layer 11. Thus, the TFT devices can be reliably fabricated on the flexible plastic substrate 10 that is easily bent, by using conventional TFT manufacturing apparatuses. Note that the light used to delaminate the plastic substrate 10 can be any light that is capable of rapidly heating the amorphous silicon layer, and is not limited to laser light. For example, a flash lamp annealing apparatus or the like may be used to rapidly heat the amorphous silicon layer by instantaneously emitting a large quantity of light like a flash of a camera.

A TFT substrate is completed in this manner, and an LCD is fabricated by using this TFT substrate.

Second Preferred Embodiment

A method for manufacturing a display device according to a second preferred embodiment of the present invention will be described below. An LCD will be described as an example of display device. Components similar to those of the first preferred embodiment are similarly fabricated by using similar materials. Thus, such components are denoted with the same reference characters as those of the first preferred embodiment, and description thereof will be omitted.

The manufacturing method of the display device according to the second preferred embodiment is characterized by further forming an Al thin film 25 (a protective layer) after forming the insulating film 11 on the back surface of the plastic substrate 10. The protective layer, such as the Al thin film 25, is effective especially when the insulating layer 11, and the TFT devices that are fabricated over the plastic substrate 10 need to be protected from laser light or the like, with which the plastic substrate 10 is irradiated to cause the plastic substrate 10 to delaminate.

Figure 6:
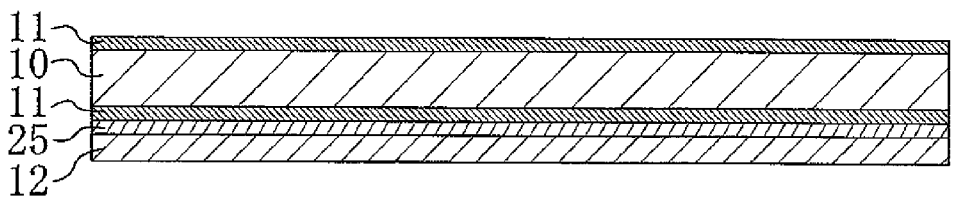
FIG. 6 is a cross-sectional view of a plastic substrate having a hydrogenated amorphous silicon layer formed thereon, according to a second preferred embodiment of the present invention.

First, as shown in FIG. 6, a plastic substrate 10 is prepared as a flexible substrate, and an insulating layer 11 is formed on the front and back surfaces of the plastic substrate 10.

Next, an Al thin film 25 (a protective layer) preferably having a thickness of, e.g., about 50 nm to about 1,000 nm, and more preferably about 100 nm to about 300 nm, is formed by a sputtering method or the like on the insulating layer 11 formed on the back surface of the plastic substrate 10. Note that the protective layer is not limited to the Al thin film 25, and may be any thin film that absorbs or reflects light. For example, a metal thin film, such as Ag or Mo, may be used as the protective layer.

Then, a hydrogenated amorphous silicon layer 12 (a delamination layer) is formed on the Al thin film 25 formed over the back surface of the plastic substrate 10.

FIG. 6 shows a laminated structure obtained at this stage. The laminated structure of FIG. 6 is formed by the plastic substrate 10 having the insulating layer 11 formed on the front and back surfaces thereof, the Al thin film 25 formed over the plastic substrate 10, and the hydrogenated amorphous silicon layer 12 formed on the Al thin film 25.

Then, a support substrate 14, having an adhesive layer 13 formed on its surface, is prepared.

Figure 7:
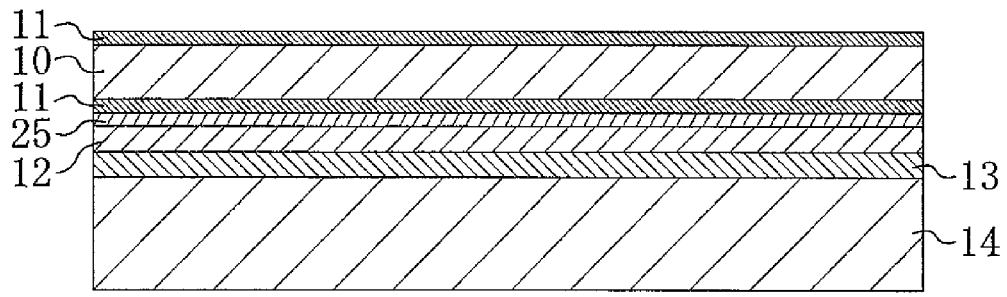
FIG. 7 is a cross-sectional view of the plastic substrate having a support substrate formed thereon, according to the second preferred embodiment of the present invention.

Then, as shown in FIG. 7, the plastic substrate 10 having the hydrogenated amorphous silicon layer 12 formed thereon is bonded to the support substrate 14 via the adhesive layer 13. At this time, the plastic substrate 10 is bonded to the support substrate 14 so that the hydrogenated amorphous silicon layer 12, formed over the back surface of the plastic substrate 10, faces the support substrate 14.

Figure 8:
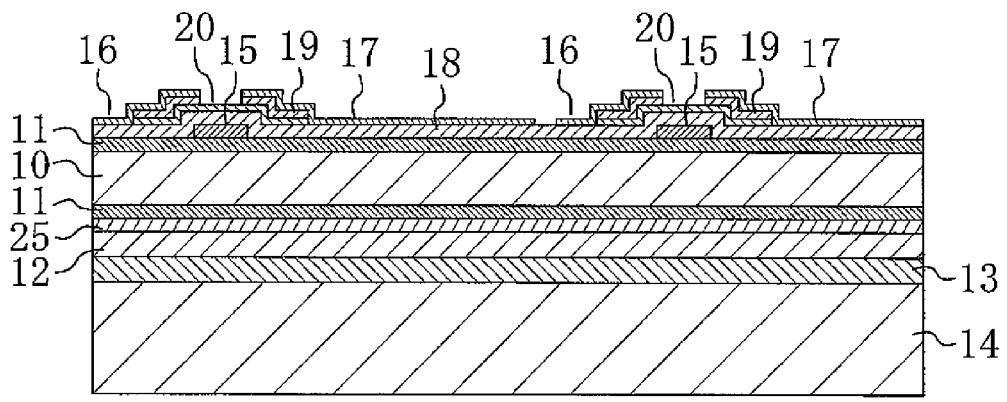
FIG. 8 is a cross-sectional view of the plastic substrate having TFT devices formed thereon, according to the second preferred embodiment of the present invention.

Then, as shown in FIG. 8, TFT devices, such as gate electrodes 15, source electrodes 16, drain electrodes 17, a gate insulating film 18, contact layers 19, and semiconductor layers 20, are formed over the plastic substrate 10.

Figure 9:
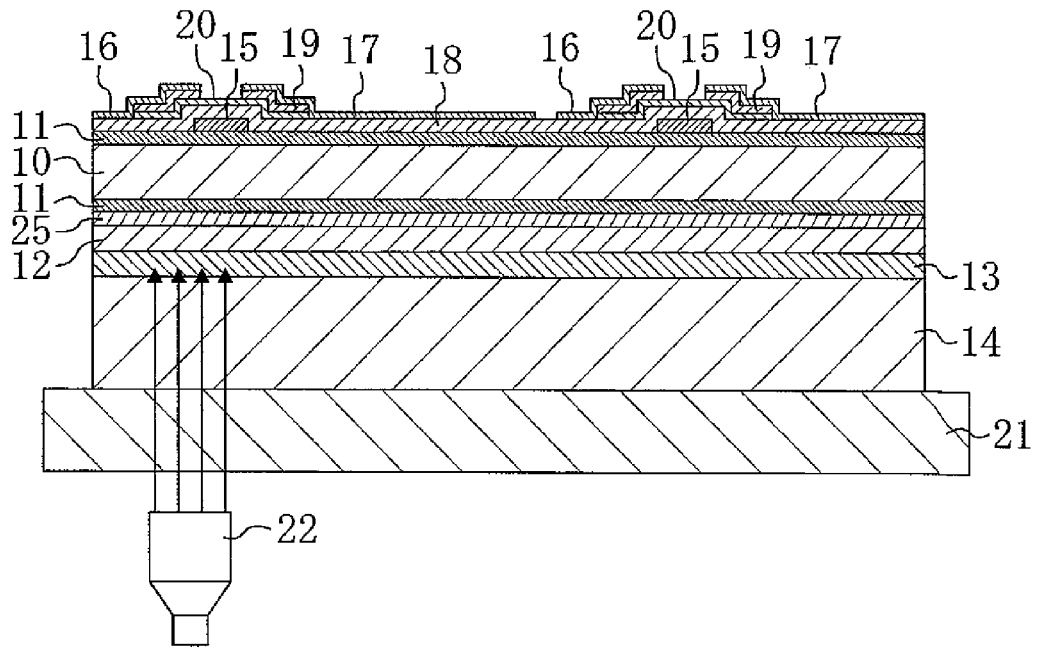
FIG. 9 is a cross-sectional view of the plastic substrate subjected to laser light, according to the second preferred embodiment of the present invention.
Figure 10:
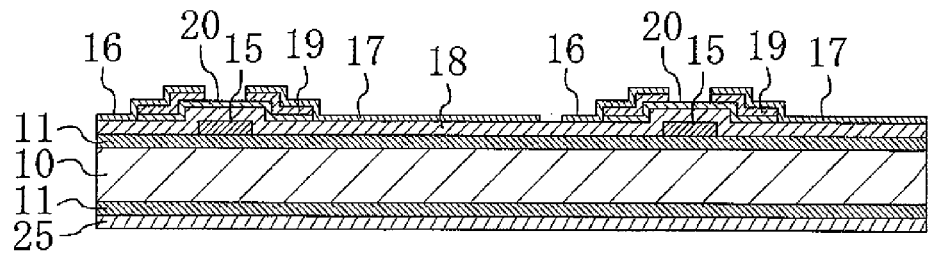
FIG. 10 is a cross-sectional view of the plastic substrate from which the hydrogenated amorphous silicon layer has been delaminated, according to the second preferred embodiment of the present invention.

Then, as shown in FIG. 9, the back surface of the plastic substrate 10 is irradiated with laser light via the support substrate 14, thereby rapidly heating the hydrogenated amorphous silicon layer 12, and desorbing hydrogen from the hydrogenated amorphous silicon layer 12. As shown in FIG. 10, as hydrogen is desorbed, the hydrogenated amorphous silicon layer 12 delaminates from the plastic substrate 10, whereby the support substrate 14 is removed from the plastic substrate 10. In this irradiation with the laser light, excess energy, which has passed through the hydrogenated amorphous silicon layer 12, is reflected by the Al thin film 25. Thus, damage to the insulating layer 11 and the TFT devices formed over the plastic substrate 10 can be reduced even if the laser energy level is too high. This stabilizes the manufacturing process, and increases the manufacturing yield.

Figure 11:
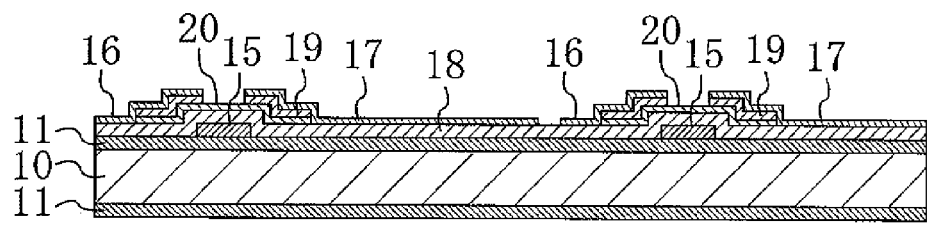
FIG. 11 is a cross-sectional view of the plastic substrate from which an Al thin film has been removed, according to the second preferred embodiment of the present invention.

Since the substrate delaminates from the interface between the Al thin film 25 and the delamination layer (the hydrogenated amorphous silicon layer 12), the Al thin film 25 remains over the back surface of the plastic substrate 10. Thus, as shown in FIG. 11, the remaining Al thin film 25 is removed by a wet etching process. At this time, the TFT devices are protected by an etching resist or the like, if necessary, in order to reduce damage to the TFT devices. Thus, any residue remaining when delaminating the substrate (any amount of delamination layer or the like remaining on the substrate side due to insufficient exposure to the laser light) can be simultaneously removed by etching the Al thin film 25.

At this time, optimizing the laser energy, the laser exposure time, and the like enables the plastic substrate 10 to be delaminated from the interface between the insulating layer 11 and the hydrogenated amorphous silicon layer 12 without damaging the insulating layer 11. Thus, the TFT devices can be reliably fabricated over the flexible plastic substrate 10 that is easily bent, by using conventional TFT manufacturing apparatuses.

A TFT substrate is completed in this manner, and an LCD is fabricated by using this TFT substrate.

Third Preferred Embodiment

A method for manufacturing a display device according to a third preferred embodiment of the present invention will be described below. An LCD will be described as an example of the display device. Components similar to those of the first and second preferred embodiments are similarly fabricated by using similar materials. Thus, such components are denoted with the same reference characters as those of the first and second preferred embodiment, and description thereof will be omitted.

A method for manufacturing a flexible LCD, which is formed by bonding a pair of plastic substrates 10a and 10b, will be described in the third preferred embodiment.

Figure 12:
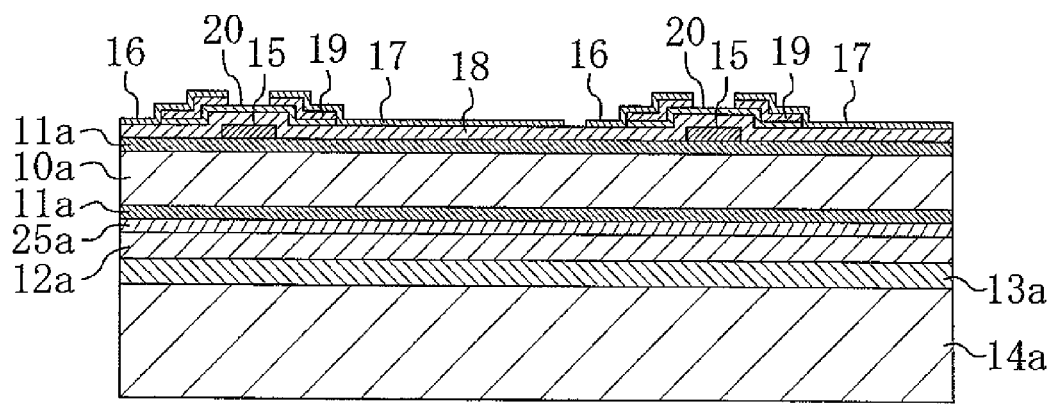
FIG. 12 is a cross-sectional view of a plastic substrate having TFT devices formed thereon, according to a third preferred embodiment of the present invention.
Figure 13:
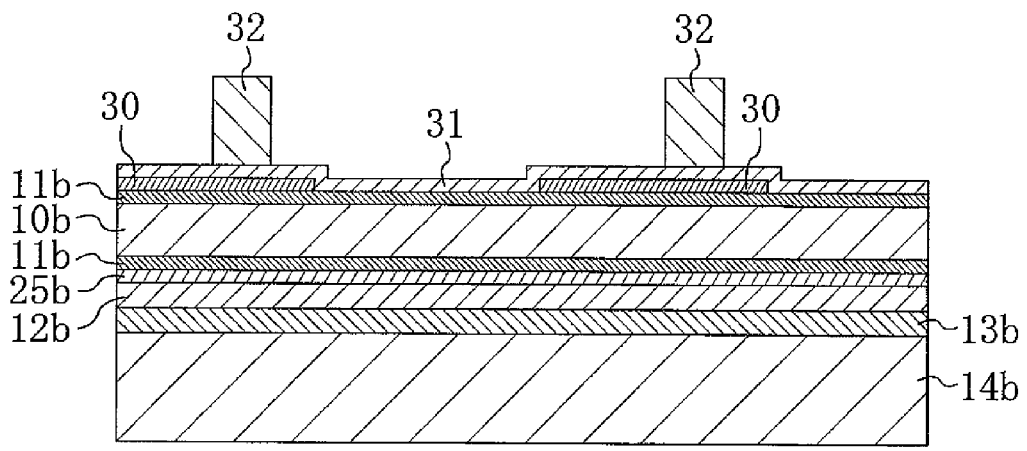
FIG. 13 is a cross-sectional view of a plastic substrate having CF devices formed thereon, according to the third preferred embodiment of the present invention.

First, as shown in FIGS. 12 and 13, a plastic substrate 10a, and a plastic substrate 10b, which serves as a counter substrate of the plastic substrate 10a, are prepared as flexible substrates, and an insulating layer 11a, 11b is formed on the front and back surfaces of each plastic substrate 10a, 10b.

Next, an Al thin film 25a, 25b (a protective layer) is formed by a sputtering method or the like on the insulating layer 11a, 11b formed on the back surface of each plastic substrate 10a, 10b, and a hydrogenated amorphous silicon layer 12a, 12b (a delamination layer) is formed on each Al thin film 25a, 25b.

Then, support substrates 14a, 14b, each having an adhesive layer 13a, 13b formed on its surface, are prepared.

Then, each plastic substrate 10a, 10b, having the hydrogenated amorphous silicon layer 12a, 12b formed thereon, is bonded to the support substrate 14a, 14b via the adhesive layer 13a, 13b. At this time, each plastic substrate 10a, 10b is bonded to the support substrate 14a, 14b so that the hydrogenated amorphous silicon layer 12a, 12b formed over the back surface of the plastic substrate 10a, 10b faces the support substrate 14a, 14b.

Then, TFT devices, such as gate electrodes 15, source electrodes 16, drain electrodes 17, a gate insulating film 18, contact layers 19, and semiconductor layers 20, are formed over the plastic substrate 10a. Moreover, color filter (CF) devices, such as light-shielding layers 30, a counter electrode 31, CF layers (not shown), and spacers 32, are formed over the plastic substrate 10b. Note that, if alignment between the plastic substrates 10a, 10b is difficult due to excessive expansion or contraction of the plastic substrate 10b, the light-shielding layers 30, the CF layers, the spacers 32, or the like may be formed over the plastic substrate 10a on which the TFT devices are formed, instead of over the plastic substrate 10b (the counter substrate).

Figure 14:
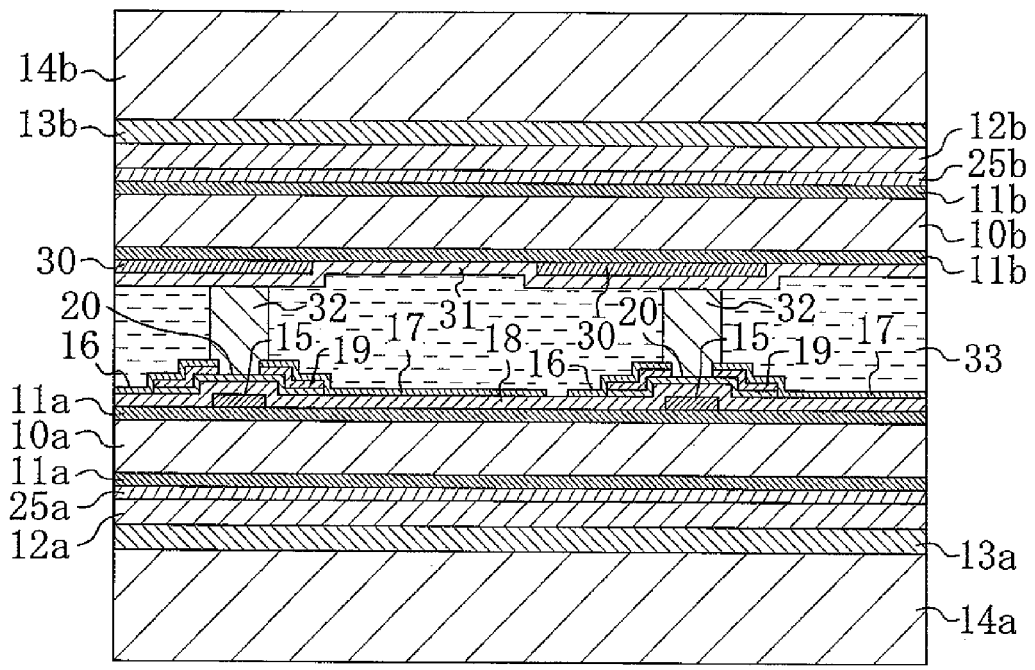
FIG. 14 is a cross-sectional view of the plastic substrates that have been bonded together, according to the third preferred embodiment of the present invention.

Then, as shown in FIG. 14, the plastic substrates 10a, 10b, respectively bonded to the support substrates 14a, 14b, are bonded together so that their respective device formation sides face each other. Then, a liquid crystal material 33 is injected into the cavity between the substrates, and is sealed. A conventional process, which is used for glass substrates, can be used almost as it is as this process.

Figure 15:
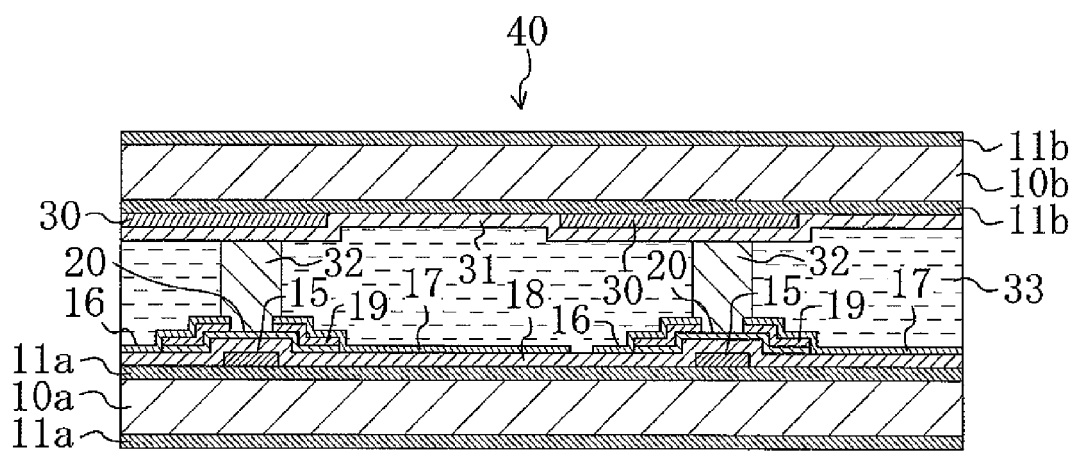
FIG. 15 is a cross-sectional view of the plastic substrates from which support substrates have been removed, respectively, according to the third preferred embodiment of the present invention.

Then, as shown in FIG. 15, the back surface of each plastic substrate 10a, 10b is irradiated with laser light via the support substrate 14a, 14b, thereby rapidly heating the hydrogenated amorphous silicon layers 12a, 12b, and desorbing hydrogen from the hydrogenated amorphous silicon layers 12a, 12b. As hydrogen is desorbed, the hydrogenated amorphous silicon layers 12a, 12b respectively delaminate from the plastic substrates 10a, 10b, whereby the support substrates 14a, 14b are respectively removed from the plastic substrates 10a, 10b. In this irradiation with laser light, excess energy, which has passed through the hydrogenated amorphous silicon layers 12a, 12b, is reflected by the Al thin films 25a, 25b, respectively. Thus, damage to the insulating layers 11a, 11b and the TFT devices formed over the plastic substrate 10a, 10b can be reduced even if the laser energy level is too high. This stabilizes the manufacturing process, and increases the manufacturing yield.

Then, residues of the Al thin films 25a, 25b, remaining over the plastic substrates 10a, 10b, respectively, are removed by a wet etching process. At this time, simultaneously etching the Al thin films 25a, 25b of both substrates in the same wet etching bath or the like is effective in terms of the manufacturing efficiency.

Moreover, optimizing the laser energy, the laser exposure time, and the like enables each plastic substrate 10a, 10b to be delaminated from the interface between the insulating layer 11a, 11b and the hydrogenated amorphous silicon layer 12a, 12b without damaging the insulating layers 11a, 11b. Thus, the TFT and CF devices can be reliably fabricated over the flexible plastic substrates 10a, 10b that are easily bent, by using conventional TFT and CF manufacturing apparatuses.

An LCD panel is completed in this manner, and a backlight and the like (not shown) are further provided to fabricate an LCD 40.

Fourth Preferred Embodiment

A method for manufacturing a display device according to a fourth preferred embodiment of the present invention will be described. The manufacturing method of the fourth preferred embodiment is different from that of the first preferred embodiment in that the fourth preferred embodiment uses a metal thin film, such as an aluminum thin film, as a delamination layer, while the first preferred embodiment uses a hydrogenated amorphous silicon layer as a delamination layer. In the fourth preferred embodiment, when an aluminum thin film (thickness: about 100 nm to about 500 nm, and about 200 nm to about 300 nm is especially preferable), formed as a delamination layer, is rapidly heated by laser light or the like, a stress is concentrated in a region near the interface between the aluminum thin film and the insulating layer, whereby the aluminum thin film delaminates from the interface between the aluminum thin film and the insulating layer. A flexible substrate can be delaminated from a support substrate in this manner. In the fourth preferred embodiment, since the aluminum thin film delaminates from the interface between the aluminum thin film and the insulating layer, no aluminum thin film remains on the flexible substrate side, whereby no etching process is required for the aluminum thin film.

Fifth Preferred Embodiment

A method for manufacturing a display device according to a fifth preferred embodiment of the present invention will be described. The fifth preferred embodiment is different from the first and fourth preferred embodiments in that the fifth preferred embodiment preferably uses a resin layer, such as a polyimide resin or a carbon-containing black resin, as a delamination layer, while the first and fourth preferred embodiments respectively use a hydrogenated amorphous silicon layer and a metal thin film as a delamination layer. In the fifth preferred embodiment, when a polyimide thin film formed as a delamination layer is irradiated with laser light or the like, the polyimide thin film is rapidly heated, and thus, expands in volume. Thus, the polyimide thin film delaminates from its interface with the insulating layer. A flexible substrate can be delaminated from a support substrate in this manner.

Note that, although an LCD (liquid crystal display) is shown as a display device in the first through fifth preferred embodiments, the display device may be a plasma display (PD), a plasma addressed liquid crystal display (PALC), an organic electroluminescence (EL), an inorganic EL, a field emission display (FED), a surface-conduction electron-emitter display (SED), or the like.

As described above, in preferred embodiments of the present invention, a plastic substrate is bonded via an adhesive layer, after forming a delamination layer such as a hydrogenated amorphous silicon layer, and a protective layer such as an Al thin film. In this state, devices are fabricated by a conventional TFT process. After the process is finished, hydrogen is desorbed from the hydrogenated amorphous silicon layer by irradiation with laser or the like, whereby the plastic substrate is delaminated.

The greatest difference between a preferred embodiment of the present invention and a conventional delamination transfer method and the like is that an object to be delaminated is not a fragile one like a device layer, but a mechanically highly stable plastic substrate. Device layers, which are delaminated and transferred by the delamination transfer method, not only have a thickness as thin as about several micrometers, but also are fabricated by depositing thin films. Thus, the device layers are very fragile. On the other hand, unlike the thin films, plastic substrates are fabricated by drawing a homogeneous material by an industrial process, or impregnating glass fibers with a resin. Thus, the plastic substrates are structurally stable, and are very strong even when their thickness is as small as several micrometers. In actual applications, plastic substrates having a thickness of about several tens to about several hundreds of micrometers are especially preferable due to the ease of use as final products. Unlike the device layers, these plastic substrates are not easily broken. Thus, even if adhesive strength remains in some regions when delaminating a plastic substrate from a support substrate by irradiation with laser light or the like, the plastic substrate can be easily delaminated from the support substrate because the overall adhesive strength has been sufficiently reduced. Even if the regions where the adhesive strength remains are forcibly delaminated, only small pieces of a silicon film or the like remain on the back surface of the plastic substrate, and a device layer formed on the front surface of the plastic substrate is not adversely affected. Thus, the plastic substrate can be delaminated in a very stable manner. Thus, according to various preferred embodiments of the present invention, a flexible substrate, such as a plastic substrate, can be satisfactorily bonded to a support substrate while the flexible substrate is being processed or carried, and damage to the flexible substrate can be satisfactorily reduced when removing the support substrate.

As described above, preferred embodiments of the present invention relate to methods for manufacturing a display device, and laminated structures.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for manufacturing a display device, comprising:
    a substrate preparing step of preparing a flexible substrate including a delamination layer formed on a back surface of the flexible substrate;
    a support substrate bonding step of bonding a support substrate to the delamination layer of the flexible substrate via an adhesive layer;
    a device forming step of forming devices on a front surface of the flexible substrate having the support substrate bonded thereto; and
    a support substrate removing step of removing the support substrate by delaminating the delamination layer from the flexible substrate having the devices formed thereon.

2. The method of claim 1, wherein the delamination layer includes hydrogen, and in the support substrate removing step, the back surface of the flexible substrate is irradiated with light so as to desorb hydrogen from the delamination layer such that the delamination layer is delaminated from the flexible substrate.

3. The method of claim 2, wherein the delamination layer is made of an amorphous silicon thin film.

4. The method of claim 3, wherein a hydrogen concentration in the amorphous silicon thin film is about 4 mass % to about 30 mass %.

5. The method of claim 3, wherein a hydrogen concentration in the amorphous silicon thin film is about 10 mass % to about 20 mass %.

6. The method of claim 3, wherein the amorphous silicon thin film is formed by applying a solution, which includes grains containing amorphous silicon and having a grain size of about 1 nm to about 100 nm, to the back surface of the flexible substrate to form a film, and then, subjecting the film to a heat treatment to form a dense film.

7. The method of claim 2, wherein the light has a wavelength of about 250 nm to about 650 nm.

8. The method of claim 2, wherein the light has a wavelength of about 350 nm to about 550 nm.

9. The method of claim 1, wherein the delamination layer is formed to have a thickness of about 30 nm to about 1,000 nm.

10. The method of claim 1, wherein the delamination layer is formed to have a thickness of about 100 nm to about 500 nm.

11. The method of claim 1, wherein the adhesive layer is made of a silicone resin.

12. The method of claim 1, wherein the adhesive layer is formed to have a thickness of about 5 µm to about 300 µm.

13. The method of claim 1, wherein the adhesive layer is formed to have a thickness of about 50 µm to about 150 µm.

14. The method of claim 1, wherein a difference in linear expansion coefficient between the support substrate and the flexible substrate is 0 to about 10 ppm/° C.

15. The method of claim 1, wherein a difference in linear expansion coefficient between the support substrate and the flexible substrate is 0 to about 3 ppm/° C.

16. The method of claim 1, wherein the flexible substrate has a thickness of about 3 µm to about 200 µm.

17. The method of claim 1, wherein the flexible substrate has a thickness of about 30 µm to about 100 µm.

18. The method of claim 1, wherein the support substrate has a thickness of about 0.5 mm to about 1.5 mm.

19. The method of claim 1, wherein the support substrate has a thickness of about 0.7 mm to about 1.1 mm.

20. The method of claim 1, wherein a protective layer is provided between the flexible substrate and the delamination layer, which are prepared in the substrate preparing step.

21. The method of claim 20, wherein the protective layer is made of a metal thin film.

22. The method of claim 21, wherein the metal thin film contains Al, Ag, or Mo.

23. The method of claim 20, wherein the protective layer has a thickness of about 50 nm to about 1,000 nm.

24. The method of claim 20, wherein the protective layer has a thickness of about 100 nm to about 300 nm.

25. The method of claim 1, wherein the delamination layer is made of a resin layer.

26. The method of claim 25, wherein the resin layer is made of a polyimide resin, or a resin containing carbon grains.

27. The method of claim 1, wherein in the support substrate removing step, the delamination layer is delaminated by its own thermal expansion.

28. The method of claim 1, wherein the delamination layer is made of a metal thin film.

29. The method of claim 20, wherein the metal thin film of the delamination layer includes Al.

30. The method of claim 1, wherein the support substrate is made of glass containing $SiO_2$.

31. The method of claim 1, wherein the support substrate has a linear expansion coefficient of about 4 ppm/° C. to about 20 ppm/° C.

32. The method of claim 1, wherein the support substrate has a linear expansion coefficient of about 8 ppm/° C. to about 15 ppm/° C.

33. The method of claim 1, wherein a barrier layer is formed on a back surface and/or an end surface of the support substrate at least before the support substrate removing step.

34. The method of claim 33, wherein the barrier layer is formed by laminating any one of a SiNx layer, a $SiO_2$ layer, a SiON layer, and an organic insulating layer, or by laminating layers selected from the SiNx layer, the $SiO_2$ layer, the SiON layer, and the organic insulating layer.

* * * * *